(12) United States Patent
Vallet Glenisson

(10) Patent No.: US 12,386,897 B2
(45) Date of Patent: Aug. 12, 2025

(54) COMPRESSED GRAPH NOTATION

(71) Applicant: DASSAULT SYSTEMES, Vélizy-Villacoublay (FR)

(72) Inventor: Eric Vallet Glenisson, Vélizy-Villacoublay (FR)

(73) Assignee: DASSAULT SYSTEMES, Velizy-Villacoublay (FR)

( * ) Notice: Subject to any disclaimer, the term of this patent is extended or adjusted under 35 U.S.C. 154(b) by 29 days.

(21) Appl. No.: 18/067,902

(22) Filed: Dec. 19, 2022

(65) Prior Publication Data
US 2023/0195796 A1    Jun. 22, 2023

(30) Foreign Application Priority Data

Dec. 17, 2021 (EP) .................................... 21306839

(51) Int. Cl.
*G06F 16/901* (2019.01)
*G06F 7/08* (2006.01)
*G06F 16/906* (2019.01)

(52) U.S. Cl.
CPC ............ *G06F 16/9024* (2019.01); *G06F 7/08* (2013.01); *G06F 16/906* (2019.01)

(58) Field of Classification Search
None
See application file for complete search history.

(56) References Cited

U.S. PATENT DOCUMENTS

| 8,782,017 B2 * | 7/2014 | Das | G06F 16/86 707/693 |
| 11,669,540 B2 * | 6/2023 | Griffith | G06F 16/258 707/693 |

(Continued)

FOREIGN PATENT DOCUMENTS

| CN | 106709006 B | 10/2020 | |
| WO | WO-2017191877 A1 * | 11/2017 | ............. G06F 17/30 |

OTHER PUBLICATIONS

Dawelbeit, Omer, and Rachel McCrindle. "Efficient dictionary compression for processing RDF big data using google BigQuery." 2016 IEEE Global Communications Conference (Globecom). IEEE, 2016. pp. 1-6 (Year: 2016).*

(Continued)

*Primary Examiner* — Tony Mahmoudi
*Assistant Examiner* — Umar Mian
(74) *Attorney, Agent, or Firm* — Oblon, McClelland, Maier & Neustadt, L.L.P.

(57) ABSTRACT

A method for compressing RDF tuples. The method including obtaining RDF tuples, obtaining a dictionary of indices, encoding for each RDF tuple the indices attributed to the subject and the object, grouping RDF tuples sharing the same predicate and for each group sorting the RDF tuples by considering the encoding of the subject and the object, and for each group of sorted RDF tuples, serializing the index of the shared predicate, serializing the encoding of the subject and the object of a first RDF tuple, and for each RDF tuple of the group of sorted RDF tuples subsequent to the first RDF tuple of the group, computing a difference between the encoding of the subject and the object of a current RDF tuple and the encoding of the subject and the object of a previous RDF tuple, and serializing the computed difference in a form of a variable-length integer.

13 Claims, 5 Drawing Sheets

(56) References Cited

U.S. PATENT DOCUMENTS

2010/0036862 A1    2/2010    Das et al.
2014/0156587 A1*  6/2014    Momtchev ............ G06F 16/283
                                                                     707/600

OTHER PUBLICATIONS

Marti-nez-Prieto, Miguel A., Javier D. Fernandez, and Rodrigo Canovas. "Compression of RDF dictionaries." Proceedings of the 27th Annual ACM Symposium on Applied Computing. 2012. pp. 340-347 (Year: 2012).*

The extended European search report mailed Jun. 28, 2022 in corresponding European Patent Application No. 21306839.8 (12 pages).

RDF 1.1 Concepts and Abstract Syntax, online, https://www.w3.org/TR/rdf11-concepts/.

RDF 1.1 Turtle, online, https://www.w3.org/TR/turtle/.

Abadi, D.J., Marcus, A., Madden, S.R. and Hollenbach, K., Sep. 2007, Scalable semantic web data management using vertical partitioning. In Proceedings of the 33rd international conference on Very large data bases (pp. 411-422). VLDB Endowment.

"Adjacency matric", online, https://en.wikipedia.org/wiki/Adjacency_matrix.

"Z-order curve", online, https://en.wikipedia.org/wiki/Z-order_curve.

"BSON", online, https://en.wikipedia.org/wiki/BSON.

"MessagePack", online, https://msgpack.org/.

Hernandez-Illera Antonio et al: "RDF-TR: Exploiting structural redundancies to boost RDF compression", Information Sciences. Elsevier, Amsterdam, NL, vol. 508, Aug. 29, 2019 (Aug. 29, 2019), pp. 234-259, XP085813298, ISSN: 0020-0255, DOI: 10.1016/J.INS.2019.08.081.

Anonymous: "Technical Specification—RDF HDT", rdfhdt . org, Jun. 22, 2021—pp. 1-15,XP055925114—Retrieved from the Internet: URL:https://web.archive.org/web/2021062208 1206/https://www.rdfhdt.org/technical-spec ification/.

Doublehyphen: "morton-encoding: A crate for encoding and decoding Morton ( "Z-order") keys.", GitHub, Mar. 26, 2021 (Mar. 26, 2021), pp. 1-2, XP055925468, Retrieved from the Internet: URL:https://github.com/DoubleHyphen/morton -Encoding.

* cited by examiner

| Index | Value |
|---|---|
| 1 | fb:astronomy.astronomical_observatory.discoveries |
| 2 | fb:type.property.unique |
| 3 | "false" |
| 4 | a |
| 5 | rdfs:Property |
| 6 | fb:m.0c3tjrp |
| 7 | http://rdf.freebase.com/key/en |
| 8 | "10726_elodie" |
| 9 | http://rdf.freebase.com/key/wikipedia.en |
| 10 | fb:astronomy.astronomical_discovery |
| 11 | fb:astronomy.celestial_object |

FIG. 2

| Index | Value |
|---|---|
| 1 | fb:astronomy.astronomical_observatory.discoveries |
| 2 | fb:type.property.unique |
| 3 | "false" |
| 4 | a |
| 5 | http://www.example.com/Graph.data |
| 6 | rdfs:Property |
| 7 | fb:m.0c3tjrp |
| 8 | http://rdf.freebase.com/key/en |
| 9 | "10726_elodie" |
| 10 | http://rdf.freebase.com/key/wikipedia.en |
| 11 | fb:astronomy.astronomical_discovery |
| 12 | fb:astronomy.celestial_object |

FIG. 3

| Index | Value |
|---|---|
| 1 | fb:astronomy.astronomical_observatory.discoveries |
| 2 | "false" |
| 3 | rdfs:Property |
| 4 | fb:m.0c3tjrp |
| 5 | "10726_elodie" |
| 6 | fb:astronomy.astronomical_discovery |
| 7 | fb:astronomy.celestial_object |

FIG. 6

| Index | Value |
|---|---|
| 1 | fb:type.property.unique |
| 2 | a |
| 3 | http://rdf.freebase.com/key/en |
| 4 | http://rdf.freebase.com/key/wikipedia.en |

FIG. 7

| Index | Value |
|---|---|
| 1 | http://www.example.com/Graph.data |

FIG. 8

COMPRESSED GRAPH NOTATION

CROSS-REFERENCE TO RELATED APPLICATIONS

This application claims priority under 35 U.S.C. § 119 or 365 to European Application No. 21306839.8, filed Dec. 17, 2021. The entire contents of the above application(s) are incorporated herein by reference.

FIELD

The disclosure relates to the field of computer programs and systems, and more specifically to a method, system and program for compressing and/or decompressing Resource Description Framework (RDF) tuples.

BACKGROUND

A number of systems and programs are offered on the market for the design, the engineering and the manufacturing of objects. CAD is an acronym for Computer-Aided Design, e.g., it relates to software solutions for designing an object. CAE is an acronym for Computer-Aided Engineering, e.g., it relates to software solutions for simulating the physical behaviour of a future product. CAM is an acronym for Computer-Aided Manufacturing, e.g., it relates to software solutions for defining manufacturing processes and operations. In such computer-aided design systems, the graphical user interface plays an important role as regards the efficiency of these techniques. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

These applications are examples of "creative authoring applications" that provide the users with the capability of exploring different solutions, using an incremental method to solve problems by saving and accessing different states of their work, and alternating working in isolation from each other with sharing data between users. Storing the history of modifications and accessing past states of the database means a large quantity of data are exchanged and/or persisted between at least two processes. These data need to be transferred for different use cases; for example edition, simulation and share of modifications. Data may be for example graphs and graphs differences. These graphs and graphs differences may represent, as an example, engineering data and/or borehole data and/or geographic positions in CAD applications.

RDF graphs are a traditional data model used for the storage and the retrieving of these graphs and graphs differences.

The RDF specification has been published by the World Wide Web Consortium (W3C) to represent information as graphs, see for example RDF 1.1 Concepts and Abstract Syntax published here: www.w3.org/TR/rdf11-concepts/. The core structure of the abstract syntax used is a set of triples, each consisting of a subject, a predicate and an object. A set of such RDF triples is called an RDF graph. An RDF graph may be visualized as a node and a directed-arc diagram, in which each triple is represented as a node-arc-node link. As an example, an RDF triple may have two nodes, which are the subject and the object and an arc connecting them, which is the predicate. More information about RDF can be found here: www.w3.org/TR/rdf11-conceptsMdata-model The most widely used format to exchange RDF graphs is the W3C TURTLE format, which is described here: www.w3.org/TR/turtle/. W3C TURTLE format is a textual syntax for RDF that allows an RDF graph to be completely written in a compact and natural text form. Yet it is written in plain text, which induces a parsing cost. It has a compression strategy where subjects and/or predicates can be factorized: it decreases the size of a TURTLE file but comes with a higher cost in parsing and does not fully eliminate the redundancy of objects or predicates.

To transfer RDF tuples with a very high throughput potentially over the network, one solution is to improve the compression of each RDF tuple. Data compression, also called here compression, is a process of encoding information using fewer bits than the original representation. Compression is useful because it reduces resources required to store and transmit data. For example, the transfer of compressed RDF tuples involves less data sent between two processes per RDF tuple and thus improve performances. That is why data compression is a key concept to transfer RDF tuples with a very high throughput between two processes (e.g., over the network).

Compression of graphs may be done by compressing RDF tuples since RDF is used to represent information as graph. A compressed graph, or in other words a graph whose data have been compressed, is interesting wherever you need to exchange or store a graph, or the difference between two graphs. Compressing an RDF tuple is the process of reducing the size of an RDF tuple.

However, the above discussed solutions suffer lack of performances. Indeed, experiments showed that the maximum raw throughput achieved with the most efficient known standard formats on standard machines hardly exceeds an insertion rate of 700,000 RDF triples per second.

Considering the increasing size of the graphs used by current applications (e.g., such CAD, CAE, CAM, PLM presented previously), it is important to be able to reach at minimum an insertion rate of 1 Million RDF tuples per second (i.e., 2 Million edges including doubles and/or reuse and 1 Million arcs per second), on a standard machine. In order to reach an insertion rate of 1 Million RDF tuples per second on a standard machine, it is therefore essential to improve the compression of each RDF tuple. An insertion rate is the transfer of data from a target source, which may be for example a database or a read-only index or a file, to a database where the data are stored and accessible on a single node. A single node is a non-distributed node. It is used to define the insertion rate in order to be agnostic to the network cost. As an example, a standard machine may be defined as a computer with quad core processor and 8 gigabytes ram.

Within this context, there is still a need for an improved method to compress RDF tuples.

SUMMARY

It is therefore provided a computer-implemented method for compressing RDF tuples. The method comprises:
- providing RDF tuples, each RDF tuple comprising a subject, an object and a predicate;
- providing a dictionary of indices, each index being attributed to one of the subjects, the objects and the predicates of the provided RDF tuples;
- encoding for each RDF tuple the indices attributed to the subject and the object;
- grouping RDF tuples sharing the same predicate and for each group sorting the RDF tuples by considering the encoding of the subject and the object; and
- for each group of sorted RDF tuples:
  - serializing the index of the shared predicate;
  - serializing the encoding of the subject and the object of a first RDF tuple of the group of sorted RDF tuples; and
    - for each RDF tuple of the group of sorted RDF tuples subsequent to the first RDF tuple of the group:
      - computing a difference between the encoding of the subject and the object of a current RDF tuple and the encoding of the subject and the object of a previous RDF tuple; and
      - serializing the computed difference in a form of a variable-length integer.

In examples, the method may further comprise one or more of the following:
- the encoding is a Morton encoding;
- the sorted RDF tuples of each group are sorted by increasing order or a partial increasing order or partially only;
- each RDF tuple of the provided RDF tuples also comprises a graph; the provided dictionary of indices also comprises an index being attributed to one of the graphs of the provided RDF tuples; the grouping being done for RDF tuples sharing the same predicate and the same graph; and the serializing of the index of the shared predicate also comprises a serializing of the index of the shared graph;
- the encoding of the subject and the object being replaced by encoding for each RDF tuple the indices attributed to the predicate and the object; the grouping being done for RDF tuples sharing the same subject; the serializing of the index of the shared predicate being replaced by the serializing of the shared subject; the serializing of the encoding of the subject and the object of a first RDF tuple of the group of sorted RDF tuples being replaced by the serializing of the encoding of the predicate and the object of a first RDF tuple of the group of sorted RDF tuples; and the computing the difference being done between the encoding of the predicate and the object of a current RDF tuple and the encoding of the predicate and the object of a previous RDF tuple;
- the encoding of the subject and the object being replaced by encoding for each RDF tuple the indices attributed to the subject and the predicate; the grouping being done for RDF tuples sharing the same object; the serializing of the index of the shared predicate being replaced by the serializing of the shared object; the serializing of the encoding of the subject and the object of a first RDF tuple of the group of sorted RDF tuples being replaced by the serializing of the encoding of the subject and the predicate of a first RDF tuple of the group of sorted RDF tuples; and the computing the difference being done between the encoding of the subject and the predicate of a current RDF tuple and the encoding of the subject and the predicate of a previous RDF tuple;
- the variable-length integer is further compressed with a lossless compression;
- the grouping also comprises counting the RDF tuples sharing the same predicate;

It is further provided a computer-implemented method for decompressing RDF tuples. The method comprises:
- providing RDF tuples compressed by the above method
- providing a dictionary of indices, each index being attributed to one of the subjects, the objects and the predicates of the provided RDF tuples; for each group of the provided RDF tuples:
  - deserializing the index of the shared predicate;
  - deserializing the encoding of the subject and the object of the first RDF tuple of the group of provided RDF tuples; and
  - for each sorted RDF tuple of the group of provided RDF tuples subsequent to the first RDF tuple of the group:
    - deserializing the computed difference;
    - computing an addition between the deserialized computed difference of a current RDF tuple and the deserialized computed difference of a previous RDF tuple;
    - decoding the computed addition; and
    - generating an RDF tuple with the deserialized predicate and the decoded addition.
- each RDF tuple of the provided RDF tuples also comprises a graph; the provided dictionary of indices also comprises an index being attributed to one of the graphs of the provided RDF tuples; the deserializing the index of the predicate also comprises deserializing the index of the graph; and the generating an RDF tuple being done with also the deserialized index of the graph.
- the providing a dictionary is replaced by generating a dictionary by indexing one of the subjects, the objects, the predicates and the optional graphs of the provided RDF tuples;
- the provided or the generated dictionary is replaced by a provided or generated dictionary of indices of the predicates and the optional graphs and a provided or generated dictionary of indices of the subject and the object.

It is further provided a computer program comprising instructions for performing the method for compressing and/or decompressing RDF tuples.

It is further provided a computer readable storage medium having recorded thereon the computer program.

It is further provided a database comprising computer readable storage medium having recorded thereon the computer program.

BRIEF DESCRIPTION OF THE DRAWINGS

Embodiments will now be described, by way of non-limiting examples, and in reference to the accompanying drawings, where:

FIG. 2 and FIG. 3 show an example of a dictionary;

FIGS. 6, 7 and 8 show an example of a dictionary.

DETAILED DESCRIPTION

Figure 1:
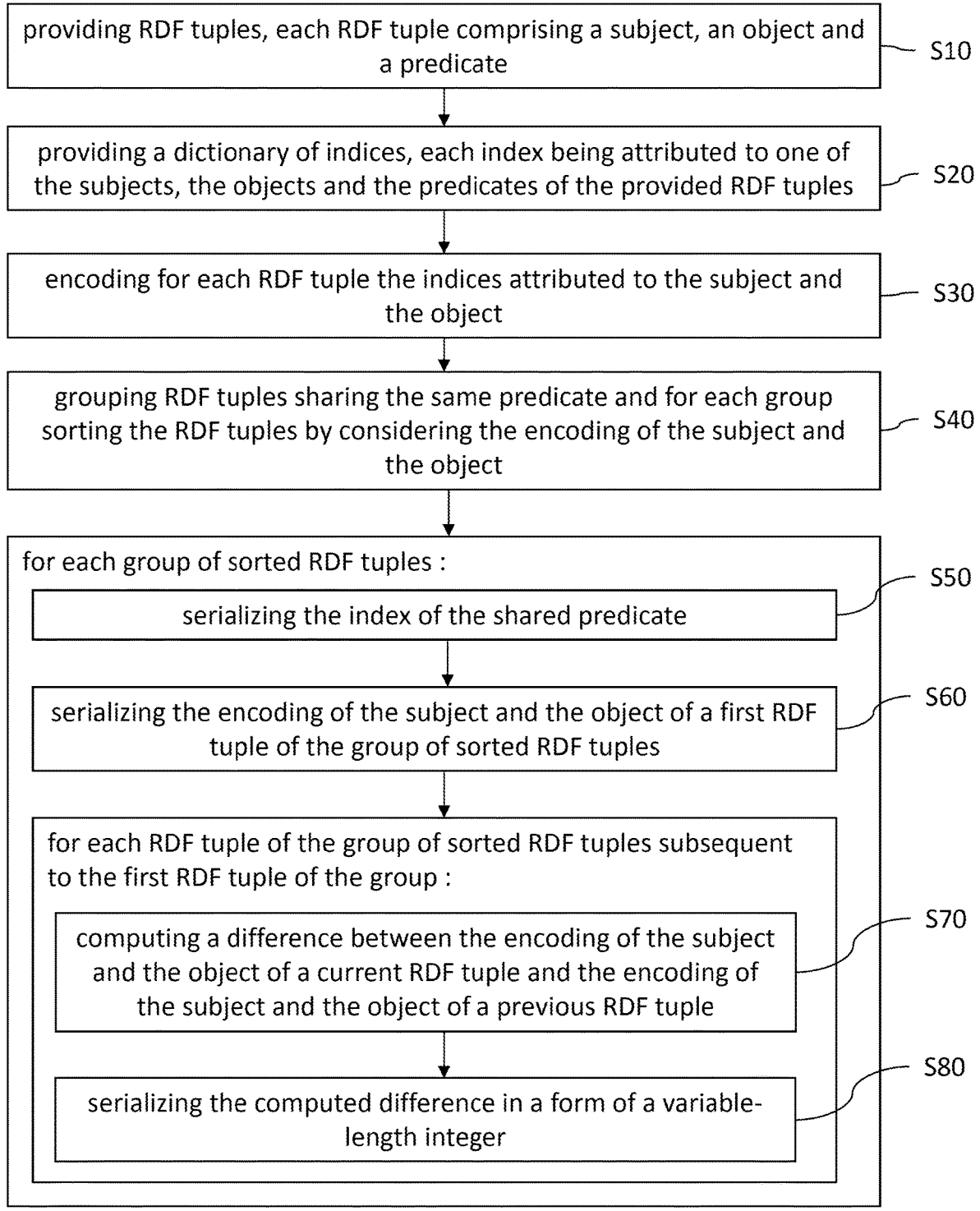
FIG. 1 shows a flowchart of an example of the method for compressing RDF tuples.

With reference to the flowchart of FIG. 1, it is described a computer-implemented method for compressing RDF tuples. The method comprises providing (S10) RDF tuples, each RDF tuple comprising a subject, an object and a predicate. In the following description, the term RDF tuple (also referred to as tuple) designates an RDF triple (also referred to as triple) or an RDF quad (also referred to as quad).

A graph label can be added to an RDF triple to obtain an RDF quad. The graph label of each quad is the graph that the quad is part of in a dataset.

In general, the term RDF tuple or tuple is used to designate an RDF triple (also called a triple) or an RDF quad (also called a quad). The term RDF tuple will be used in the following description.

The method further comprises providing (S20) a dictionary of indices, each index being attributed to one of the subjects, the objects and the predicates of the provided RDF tuples.

By "dictionary of indices", it is meant a collection of pairs of data that is used to store data values in (index; value) pairs. A dictionary may be unordered, changeable and may not allow duplicates. The index may be an integer or an unsigned integer. The storage size of the index of a dictionary may be smaller or equal to the storage size of its paired value, or the storage size of the serialized index of a dictionary may be smaller or equal to the storage size of its serialized paired value.

FIG. 2 is an example of a dictionary of indices in which each index is attributed to a value. For example, the index 2 is associated to the value "fb:type.property.unique". In FIG. 2, the indices start at 1, being understood this is an arbitrary choice only.

Still in reference to FIG. 2, an example of creation of RDF triple enumeration is now discussed. In this example, the following RDF triples enumeration can be created using the index of the dictionary of FIG. 2: each value of triple is replaced by its corresponding index
 1, 2, 3
 1, 4, 5
 6, 7, 8
 6, 9, 8
 6, 4, 10
 6, 4, 11

The triples of this example are still RDF triples, but they are represented by indices instead of values. For instance, the triple "1, 2, 3" stands for:
 fb:astronomy.astronomical_observatory.discoveries
  fb:type.property.unique "false".

At the providing S20, one or more dictionaries of indices can be used. In an example the providing S20 may comprise providing two dictionaries of indices: one dictionary of indices for the predicates, one dictionary of indices for the subjects and objects. In another example, the providing S20 may comprise providing three dictionaries of indices: one dictionary of indices for the predicates, one dictionary of indices for the subjects and one dictionary of indices for the objects. In examples, the one or more dictionaries may be exchanged between a source and a destination during the exchange of RDF tuples between the same source and the same destination, e.g., the source and the destination are computerized systems. In examples, the one or more dictionaries may be already stored by the same source and/or the same destination; further exchanges of RDF tuples may not require an exchange of one or more dictionaries between the source and the destination. In examples, the one or more dictionaries may be updated; an update may comprise adding and/or deleting one or more new pairs of (index; value) and/or replacing the respective value of one or more pairs of (index; value).

An RDF tuples enumeration, based on indices, may be seen as a prefiguration of adjacency matrices. Such a representation (seen as a prefiguration of adjacency matrices) increases in size in memory with the number of RDF tuples to be represented.

It is to be understood that such a representation (seen as a prefiguration of adjacency matrices) may also increase the number of pairs contained by each of the one or more dictionaries. The size in memory of each index limiting the number of pairs contained by a dictionary, an increase of the size in memory of each index may be needed. However, increasing the size in memory of each index is less critical (e.g., more easily achievable) than improving (increasing) the maximum of insertion rate in graphs, as previously discussed. The present disclosure aims at compressing the index resulting of the usage of a dictionary.

Back to FIG. 1, the method further comprises encoding (S30) for each RDF tuple the indices attributed to the subject and the object. By encoding, it is meant a process of changing data representation. For example, the encoding (S30) may consist in converting the indices for each RDF tuple into a representation as a binary code. The two-symbol system used is often "0" and "1" from the binary number system. The binary code assigns a pattern of binary digits, also known as bits, to each character, instruction, etc. For example, a binary string of eight bits can represent any of 256 possible values and can, therefore, represent a wide variety of different items.

Encoding the data of the subject and the object altogether allows a very good compression with classical algorithms, such as for example Snappy (discussed here: en.wikipedia.org/wiki/Snappy_(compression) or LZ4 (discussed here: en.wikipedia.org/wiki/LZ4_(compression_algorithm)).

Indeed, the applicant surprisingly discovered in a study on various datasets, including Dassault Systèmes' inhouse specific datasets and open source datasets, e.g., ChEMBL dataset or DBPedia or Freebase (more information available here: evelopers.google.com/freebase/) or Wikidata (more information available here: www.wikidata.org/wiki/Wikidata:Main_Page) or e-commerce data from the RDF Berlin benchmark (more information available here:wifo5-03.informatik.uni-mannheim.de/bizer/berlinsparqlbenchmark/), that there is a correlation between the values of the pairs (subject, object) and also that a very low entropy on the series of pairs exists. The correlation is a statistical relationship between the values of the pairs (subject, object) of the provided RDF tuples; this relationship may be expressed as a degree to which values of the pairs (subject, object) are linearly related.

The output of S30 is therefore the provided RDF tuples that have been encoded; they are now referred as encoded RDF tuples. The following steps now discussed operate on the encoded RDF tuples.

The method further comprises grouping (S40) RDF tuples sharing the same predicate and for each group sorting the RDF tuples by considering the encoding of the subject and the object. In step S40, RDF tuples having the same predicate are grouped together. Following our example illustrated above, the RDF triples "1, 4, 5", "6, 4, 10" and "6, 4, 11" shares the same predicate "a". These RDF triples are grouped together as a result of performing S40. The grouping (S40) of RDF tuples having the same predicate allows to take advantage of the observation that the predicate is the entity of the RDF tuple with less entropy. In other words, as the variability of predicates is low in RDF data, grouping RDF tuples sharing the same predicate is efficient for compressing RDF tuples.

In addition, grouping (S40) RDF tuples having the same predicate also improves processing performances for databases having a graph representation based on vertical partitioning as the vertical partitioning partitions data by predicates.

At step S40, a sorting of the RDF tuples of each group is performed by considering the encoding of the subject and the object.

In examples, the sorting may be an increasing numeral order. In other words, a first RDF tuple will be placed before a second RDF tuple if the value of the encoding of the subject and the object of the first RDF tuple is smaller than the value of the encoding of the subject and the object of the second RDF tuple; the first RDF tuple is ranked 1 and the second RDF tuple is ranked 2.

In examples, the sorting may be a decreasing numeral order. In other words, a first RDF tuple will be placed before a second RDF tuple if the value of the encoding of the subject and the object of the first RDF tuple is greater than the value of the encoding of the subject and the object of the second RDF tuple; the first RDF tuple is ranked 2 and the second RDF tuple is ranked 1.

In the event a group of RDF tuples would comprise only one RDF tuple, no sorting is performed.

Back to FIG. 1, as a result of S40, (encoded) RDF tuples have been grouped (thereby a set of groups of RDF tuples is obtained) and each group of RDF tuple have been sorted. Therefore, groups of sorted (and encoded) RDF tuples are obtained. Then, each group of sorted RDF is individually processed as follows:

i/ A serialization (S50) of the index of the shared predicate is performed; and ii/ a serialization (S60) of the encoding of the subject and the object of a first RDF tuple of the group of sorted RDF tuples is performed.

Serialization is a process of translating a data structure or object state into a format that can be stored or transmitted and reconstructed later (e.g., as a series of bits), possibly in a different computer environment. When the resulting series of bits is read again according to the serialization format, it can be used to create a semantically identical clone of the original object. The techniques (or implementations) used for performing the serializations S50 and S60 may be identical or different.

Then, for each sorted RDF tuple of the group of provided RDF tuples subsequent to the first RDF tuple of the group, the following steps are carried out:

iii/ a difference is computed (S70) between the encoding of the subject and the object of a current RDF tuple and the encoding of the subject and the object of a previous RDF tuple.

In other words, for each group of sorted RDF tuples obtained by i/ and ii/, the computing (S70) is done for all RDF tuples except for the first RDF tuple of each group of sorted RDF tuples.

For example, in order to compute (S70) the difference for the third RDF tuple in the current group of sorted tuples, the computing (S70) may be done by doing the difference between the encoding of the subject and the object of the third RDF tuple in the current group of sorted tuples and the encoding of the subject and the object of the second RDF tuple in the current group of sorted tuples.

Iv/ the computed difference is serialized (S80) in a form of a variable-length integer.

A variable-length integer is a universal code that uses an arbitrary number of binary octets to represent an arbitrarily large integer, as known in the art.

By serializing only the difference, the method of the present disclosure increases even more the compression. Indeed, a variable-length integer uses fewer bytes for serializing smaller values and take up less space than for larger values. Therefore, as the difference is computed between two consecutive tuples of a group of sorted tuples, the value of the difference is minimal and the serializing (S80) is even more efficient in term of compression.

As mentioned above, an objective of the disclosure is not the compression of the one or more dictionaries. Indeed, the one or more dictionaries do not need to be transferred and/or stored as often as the RDF tuples. Furthermore, the applicant observes that when the number of RDF tuples is significant, the size of the dictionary of predicates is very limited. Significant means that the number of RDF tuples comprises at least a thousand of RDF tuples. It is to be understood that even if the number of RDF tuples does not exceed thousand RDF tuples, the one or more dictionaries do not need to be transferred and/or stored as often as the RDF tuples.

By grouping (S40) the RDF tuples sharing the same predicate and for each group sorting the RDF tuples by considering the encoding of the subject and the object, the method is particularly efficient as the distance between the values of pairs is generally very small. Measures show that the method converges to a consumption of one or two octets per RDF tuple rather than a dozen with a naive binary implementation like the serialization of three integers in a binary form.

The method of the present disclosure provides other advantages aside from compressing well the RDF tuples. Considering a batch as a transfer unit that can be grouped, the embodiments allow transfers of data over the network in a manner as dense and as easy to process as possible. This transfer of data can be used for edition purpose, e.g., in creative authoring applications, or to share data between users. The source of these data can be for example a file made of batches, or a read-only index that can output its data in the format described by the disclosure, or another database that is also able to output its data in the format described by the disclosure.

Back to FIG. 1, it is worth noting that the steps S50, S60 and the second for-loop "for each RDF tuple of the group of sorted RDF tuples subsequent to the first RDF tuple of the group:" are the body of the first for-loop "for each group of sorted RDF tuples". The body of the second for-loop being the steps S70 and S80.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

Figure 5:
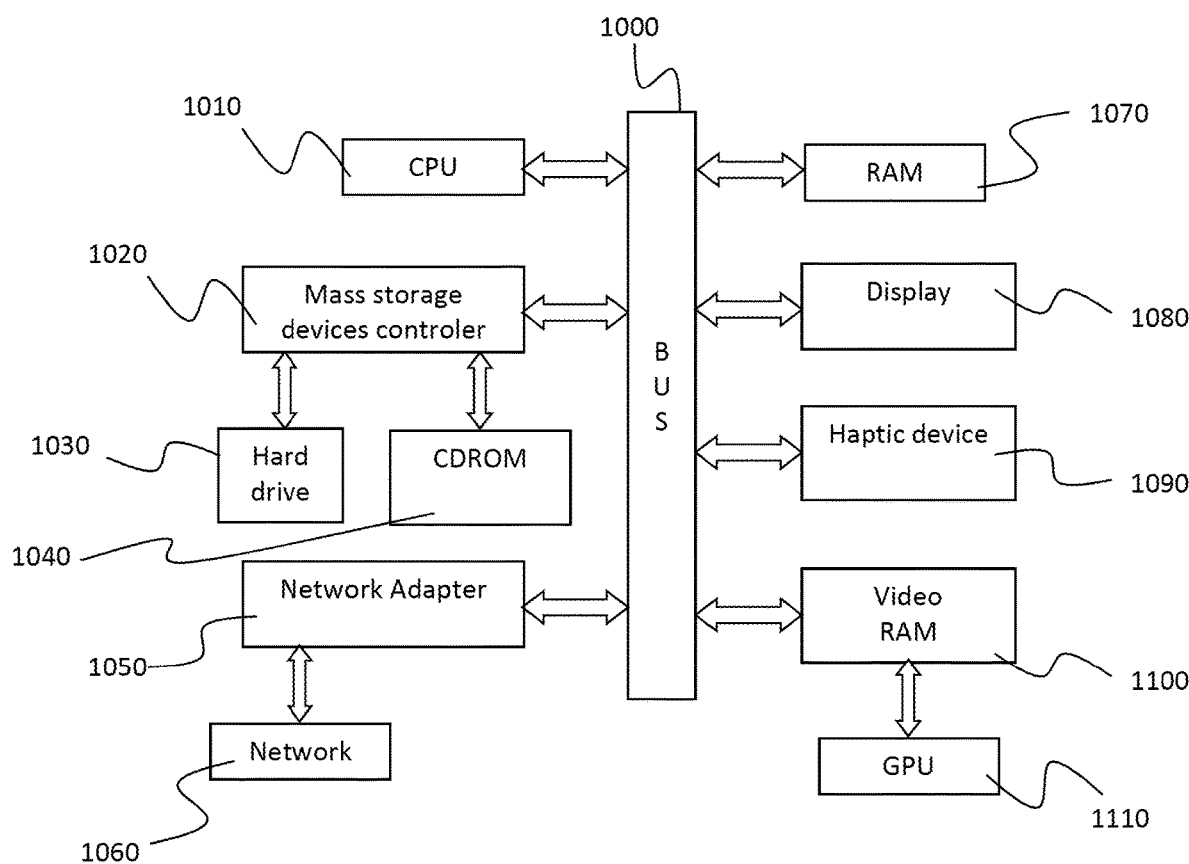
FIG. 5 shows an example of a system.

FIG. 5 shows an example of the system, wherein the system is a server, e.g., a server hosting a database.

The server of the example comprises a central processing unit (CPU) 1010 connected to an internal communication BUS 1000, a random-access memory (RAM) 1070 also connected to the BUS. The server may be further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). One or more mass memory devices may be used for implementing the storage layer of a database. A network adapter 1050 manages accesses to a network 1060. The server may also include a haptic device 1090 such as cursor control device, a keyboard or the like. A cursor control device is used in the server to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the server system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

A typical example of computer-implementation of a method is to perform the method with a system adapted for this purpose, e.g., a server. The system may comprise a processor coupled to a memory; the memory having recorded thereon a computer program comprising instructions for performing the method. The memory may also store a database. The memory is any hardware adapted for such storage, possibly comprising several physical distinct parts (e.g., one for the program, and possibly one for the database).

In an example, the method is employed in the process of general manipulation of modeled objects with an authoring application. A modeled object is any object defined by data stored, e.g., in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system.

For the sake of explanation only, the example of the method employed in CAD systems are now discussed.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g., non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g., representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e., increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g., mechanical) part or assembly of parts (or equivalently an assembly of parts, as the assembly of parts may be seen as a part itself from the point of view of the method, or the method may be applied independently to each part of the assembly), or more generally any rigid body assembly (e.g., a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object designed by the method may thus represent an industrial product which may be any mechanical part, such as a part of a terrestrial vehicle (including e.g., car and light truck equipment, racing cars, motorcycles, truck and motor equipment, trucks and buses, trains), a part of an aerial vehicle (including e.g., airframe equipment, aerospace equipment, propulsion equipment, defense products, airline equipment, space equipment), a part of a naval vehicle (including e.g., navy equipment, commercial ships, offshore equipment, yachts and workboats, marine equipment), a general mechanical part (including e.g., industrial manufacturing machinery, heavy mobile machinery or equipment, installed equipment, industrial equipment product, fabricated metal product, tire manufacturing product), an electromechanical or electronic part (including e.g., consumer electronics, security and/or control and/or instrumentation products, computing and communication equipment, semiconductors, medical devices and equipment), a consumer good (including e.g., furniture, home and garden products, leisure goods, fashion products, hard goods retailers' products, soft goods retailers' products), a packaging (including e.g., food and beverage and tobacco, beauty and personal care, household product packaging).

The designing process in CAD is typically a collaborative procedure and requires several people to work independently or interdependently to each other. In this matter, it is important to be able to transfer RDF data at a high frequency in order to allow users to access, edit and save their CAD models as fast as possible; this avoids waiting times for the computer system as it receives more data in a shorter time period. In examples, the history of the designing process may be stored in a database. Measures show that the method of the present disclosure allows a transfer RDF data with a throughput of 1 million triples per second from a target source to the database in which the history is stored. A target source may be a database, a read-only index or a file. The database in which the history is stored can include the collected information of a CAD model design via a creative application of several versions. These versions may have been created and/or modified by a designer or several designers which may work on the CAD model in parallel. It is to be understood that any internal basic structure to organize the data in the database files may be used.

Design software applications necessitate creative authoring that requires several versions among different design possibilities. Examples of the method of the present disclosure are discussed in the context of CAD authoring applications. It is to be understood that these examples are not limited to CAD authoring applications and can apply to any authoring application. More generally, the present method is not limited to the specific field of authoring software applications, that is, the method applies to any databases having a graph representation with RDF tuples.

Further examples of the method are now discussed.

In examples, the encoding (S30) of the method may be a Morton encoding. Morton encoding is also known as Z-order curve. Morton encoding is a compression scheme used on multidimensional data like matrices, as known in the art. The Z-value of a point in multidimensions is calculated by interleaving the binary representations of its coordinate values. For example, by applying the Morton encoding (S30) for the triple (RDF tuple) "1, 2, 3" the resulting encoding value of the index of the subject and the index of the object for this RDF-tuple is 11. More information about Morton encoding can be found here: en.wikipedia.org/wiki/Z-order_curve.

Morton encoding is particularly adapted for encoding subject and object of each RDF tuple because it explores a bitmap by proximity. Morton encoding maps multidimensional data to one dimension while preserving locality. Furthermore, Morton encoding's performances in terms of processing velocity are very good due to its constant complexity and the ability to use specific Intel processor instructions to optimize it. Therefore Morton encoding improves compression and decompression speeds for series of RDF data. In examples, the RDF tuples of each group obtained by the grouping (S40) may be sorted by an increasing order or a partial increasing order or partially only.

Sorting by increasing order the RDF tuples means that a first RDF tuple having a value greater than the value of a second RDF tuple will be placed after the second RDF tuple when the sorting is finished; all the RDF tuples of each group are sorted. Here the value of an RDF tuple may be computed by considering the encoding of the subject and the object. As explained above, the step (S70) may comprise computing a difference between the encoding of the subject and the object of a current RDF tuple and the encoding of the subject and the object of a previous RDF tuple. Sorting by an increasing order the RDF tuples of each group obtained by the grouping (S40) ensures that the difference computed at S70 is strictly positive. This allows then to serialize the computed difference in a form of a variable-length unsigned integer. Various implementation of a variable-length unsigned integer may be used. As an example, a SQLite4 variable length integer may be used. A SQLite4 variable length is an encoding of 64-bit unsigned integers into between 1 and 9 bytes. The encoding has the following properties:

Smaller (and more common) values use fewer bytes and take up less space than larger (and less common) values.

The length of any variant can be determined by looking at just the first byte of the encoding.

Lexicographical and numeric ordering for varints are the same. Hence if a group of varints are order lexicographically (that is to say, if they are order by memcmp( ) with shorter varints coming first) then those varints will also be in numeric order. This property means that varints can be used as keys in the key/value backend storage and the records will occur in numerical order of the keys.

More information about the SQLite4 variable length may be found here: sqlite.org/src4/doc/trunk/www/varint.wiki Using a variable-length unsigned integer instead of a variable-length integer improves the compression of the storage of the computed difference in step (S70).

The sorting may be performed partially only, based on either an increasing order or a decreasing order. Various examples of partial sorting are possible. In an example, the sorting (according to an increasing or a decreasing order) may be performed for only a part of the RDF tuples of the same group and the remaining RDF tuples may be unsorted. In another example, the sorting may be performed for the RDF tuples of one or more groups and the remaining groups of RDF tuples may be unsorted. In another example, the sorting may be performed for only a part of the RDF tuples of the same group and the remaining RDF tuples may already be sorted by a previous (increasing or decreasing) sorting. Let us consider each group of RDF tuples is composed of various subgroups of RDF tuples. Therefore it is possible that the RDF tuples of a same group are sorted only by subgroups. In other words, the position of a subgroup relatively to the other subgroups of the same group may not change but inside each subgroup, the position of each RDF tuples may change. Hence, if the sorting in increasing order is done only partially, the RDF tuple having the greatest value of a subgroup may be followed by the RDF tuple having the smallest value of the next subgroup. Here the value of an RDF tuple may be computed by considering the encoding of the subject and the object. The sorting in a partial only increasing order may be used for example, when each subgroup is a set of RDF tuples added to a current group. A strategy may consist of sorting only the added RDF tuples, therefore obtaining a partial sorting of the whole group.

Sorting only partially may be efficient to save resources such as Computer Processor Unit (CPU) and time during the step (S40). Indeed, sorting only a part of the RDF tuples of a group needs less computing resources and is faster than sorting entirely the RDF tuples of the group.

In examples, each RDF tuple of the provided RDF tuples may further comprise a graph. For instance, the computer-implemented method may be used for compressing RDF quads. Using RDF quads may be especially useful to group RDF triples sharing a semantic. As an example, all RDF sharing an ontology may be grouped in one graph. Thus, when the RDF tuples are RDF quads, a computer-implemented method for compressing RDF quads is thus carried out. The provided dictionary of indices may also comprise an index that is attributed to one of the graphs of the provided RDF tuples. An example of such provided dictionary is provided in FIG. 3. For example, the index "5" is attributed to the graph "www.example.com/Graph.data".

As an example, the following RDF quads enumeration can be created using the index of the dictionary of FIG. 3 instead of the corresponding values:

5, 1, 2, 3
5, 1, 4, 6
5, 7, 8, 9
5, 7, 10, 9
5, 7, 4, 11
5, 7, 4, 12

Still in examples with the RDF tuples that are RDF Quads, the grouping (S40) may be done for RDF Quads sharing the same predicate and the same graph. In other words, RDF Quads sharing the same predicate and the same graph may be grouped together. If two RDF quads have two different predicates or graphs, they may not be grouped together. Grouping RDF Quads sharing the same predicate and the same graph is especially efficient as predicates and graphs are tightly bound. In other words, for a set of RDF quads, RDF quads having a specific predicate will often share the same graph as well. Hence by grouping RDF quads having the same predicate and the same graph, the number of groups of RDF Quads is kept minimal or tends to be minimal. By keeping the number of groups of RDF Quads minimal, the number of pairs (subject, object) per group will be kept maximal, and therefore the relative cost of the compression of the data of the group will be minimal. Grouping (S40) tightly the RDF Quads sharing the same predicate and the same graph is also efficient regarding the compression performances because the pair (predicate, graph) is the entity of the RDF quads with less entropy.

Still in examples with the RDF tuples that are RDF Quads, the serializing (S50) of the index of the shared predicate also comprises a serializing of the index of the shared graph. In other words, for a group of RDF Quads sharing the same predicate and the same graph, a serializing of the shared predicate may be done at the beginning of step (S50) which may be followed by a serializing of the shared graph. In another example, the serializing of the shared graph may be done before the serializing of the shared predicate.

Still in examples with the RDF tuples that are RDF Quads, the grouping (S40) may be done for RDF Quads sharing the same subject and the same object. In this example, the serializing (S50) may be done by serializing the index of the shared subject followed or preceded by the serializing of the index of the shared object.

Still in examples with the RDF tuples that are RDF Quads, the grouping (S40) may be done for RDF Quads sharing the same graph and the same subject. In this example, the serializing (S50) may be done by serializing the index of the shared graph followed or preceded by the serializing of the index of the shared subject.

Still in examples with the RDF tuples that are RDF Quads, the grouping (S40) may be done for RDF Quads sharing the same graph and the same object. In this example, the serializing (S50) may be done by serializing the index of the shared graph followed or preceded by the serializing of the index of the shared object.

Still in examples with the RDF tuples that are RDF Quads, the grouping (S40) may be done for RDF Quads sharing the same predicate and the same object. In this example, the serializing (S50) may be done by serializing the index of the shared predicate followed or preceded by the serializing of the index of the shared object.

Still in examples with the RDF tuples that are RDF Quads, the grouping (S40) may be done for RDF Quads sharing the same subject and the same predicate. In this example, the serializing (S50) may be done by serializing the index of the shared subject followed or preceded by the serializing of the index of the shared predicate.

In examples, the encoding (S30) of the subject and the object may be replaced by encoding for each RDF tuple the indices attributed to the predicate and the object, the grouping (S40) may be done for RDF tuples sharing the same subject, the serializing (S50) of the index of the shared predicate may be replaced by the serializing of the shared subject, the serializing (S60) of the encoding of the subject and the object of a first RDF tuple of the group of sorted RDF tuples may be replaced by the serializing of the encoding of the predicate and the object of a first RDF tuple of the group of sorted RDF tuples and the computing (S70) the difference may be done between the encoding of the predicate and the object of a current RDF tuple and the encoding of the predicate and the object of a previous RDF tuple. This example is well suited to compress RDF tuples, either RDF triples or RDF quads, wherein the RDF tuples are used to represent knowledge which is object-oriented. It is also especially adapted to represent knowledge based on documents. Object-oriented data model (OODM) is a data modeling able to work with complex data objects that mirror those used in object-oriented programming languages (see here for more information about object-oriented programming languages: en.wikipedia.org/wiki/Object-oriented_programming). In other words, the elements of an OODM may be:

object: a real world entity, such as a specific life task in a to-do list—"take the garbage out";

attributes: an object has state and behaviors. An object has properties (which might also be called attributes) like name, status, and create date. The set of properties taken together represents its state.

class: the grouping of all objects with the same properties form a class. In the example was about task objects. These objects together all belong to the Task class. In examples, the encoding (S30) of the subject and the object may be replaced by encoding for each RDF tuple the indices attributed to the subject and the predicate, the grouping (S40) may be done for RDF tuples sharing the same object, the serializing (S50) of the index of the shared predicate may be replaced by the serializing of the shared object, the serializing (S60) of the encoding of the subject and the object of a first RDF tuple of the group of sorted RDF tuples being replaced by the serializing of the encoding of the subject and the predicate of a first RDF tuple of the group of sorted RDF tuples and the computing (S70) the difference may be done between the encoding of the subject and the predicate of a current RDF tuple and the encoding of the subject and the predicate of a previous RDF tuple.

In examples, the variable length integer of step S80 may be further compressed with a lossless compression. Lossless compression may be defined as a class of data compression algorithms that allows the original data to be perfectly reconstructed from the compressed data. Lossless compression known in the art are compatible with all the different embodiments. For example, lossless compression methods such as Snappy or LZ4 may be used to compress the variable-length integer obtained in step S80. This compression further increases the compression rate of method of the present disclosure.

In examples, the grouping (S40) also comprises counting the RDF tuples sharing the same predicate. The result of the counting, which is the number of RDF tuples sharing the same predicate, may then be used as a terminating value for the step S70 and S80 which are done iteratively for each RDF tuple of each group of sorted RDF tuples subsequent to the first RDF tuple of the current group. As an example of implementation, a for-loop may be used with a terminating value set to the result of the counting. The result of the counting may also be serialized in order to be deserialized and read during the decompression of the RDF tuples.

Another way of implementing a terminating strategy for the step S70 and S80 which are done iteratively for each RDF tuple of each group of sorted RDF tuples subsequent to the first RDF tuple of the current group is to serialize the value "0" (zero) after the computed difference in step S70 and S80 for the last RDF tuple of the group. In other word, when the computing (S70) a difference between the encoding of the subject and the object of the last RDF tuple of the group and the encoding of the subject and the object of the before last RDF tuple is serialized (S80), a value "0" (zero) may be serialized afterwards. This value "0" (zero) may be deserialized during the decompression of the RDF tuples and used to identify the end of a group of RDF tuples. It may be worth noting that the choice of the value "0" (zero) is not arbitrary because a computed difference of step S70 may never be equal to zero as there is no duplicated value in the dictionary provided (S20).

Figure 4:
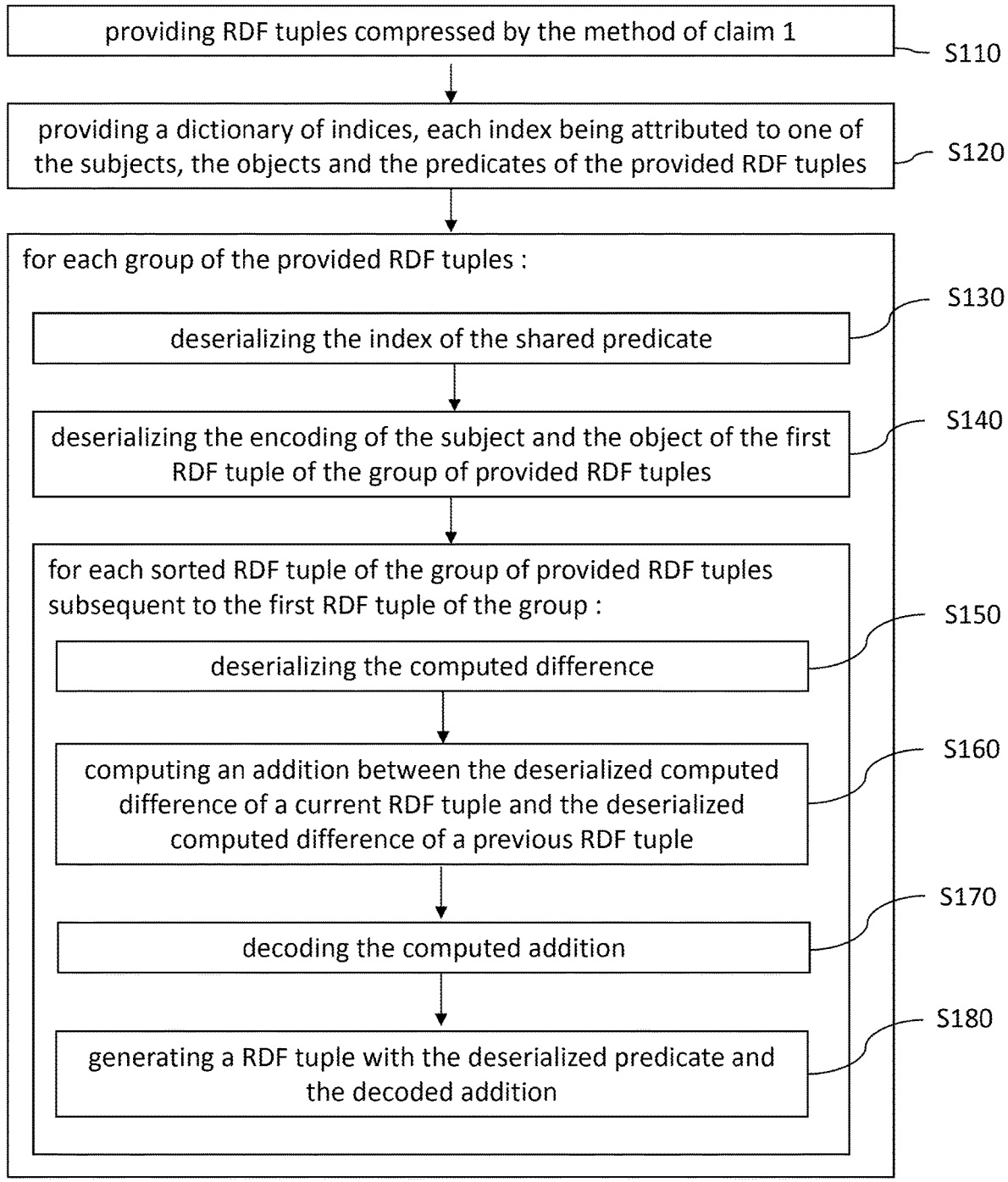
FIG. 4 shows a flowchart of an example of the method for decompressing RDF tuples.

With reference to the flowchart of FIG. 4, it is proposed a computer-implemented method for decompressing RDF tuples that have been compressed with the method discussed in reference to FIG. 1.

The method decompressing RDF tuples comprises providing (S110) RDF tuples that have been compressed with the method discussed in reference to FIG. 1. The method further comprises providing (S120) a dictionary of indices, each index being attributed to one of the subjects, the objects and the predicates of the provided RDF tuples.

The provided RDF tuples having been compressed, the provided RDF tuples are grouped as discussed in reference to S40: RDF tuples have been grouped and each group of RDF tuple have been sorted. Therefore, groups of sorted (and encoded) RDF tuples are provided.

Next, the method further comprises, for each group of the provided RDF tuples, deserializing (S130) the index of the shared predicate and deserializing (S140) the encoding of the subject and the object of the first RDF tuple of the group of the provided RDF tuples. Deserialization may be defined as the reverse operation of serialization. It consists of extracting a data structure from a series of bytes. It is worth noting that the deserializing (S130) may be the reverse operation of the serializing (S50) and the deserializing (S140) may be the reverse operation of the serializing (S60). By "reverse operation", it is meant that the deserializing allows retrieving an equivalent data structure or the same data structure than the one which has been serialized.

Next, the following steps are carried out for each sorted RDF tuple of each group of provided RDF tuples subsequent to the first RDF tuple of the group:

i/ the computed difference is deserialized (150). As an example, the difference may have been computed (S50) between the encoding of the subject and the object of a current RDF tuple and the encoding of the subject and the object of a previous RDF tuple. The deserializing (S150) is the reverse operation of the serializing (S80).

ii/ An addition is computed (S160) between the deserialized computed difference of a current RDF tuple and the deserialized computed difference of a previous RDF tuple and the computed addition is decoded (S170). Decoding is the reverse process of encoding discussed in reference compression method of the present disclosure, which may be defined as the conversion of an encoded format back into the original sequence of characters.

III/ an RDF tuple is generated (S180) with the deserialized predicate and the decoded addition. In example, to generate an RDF tuple (S180) with the deserialized predicate and the decoded addition, the dictionary provided (S120) may be used to retrieve the value from the index of the subject, the object and the predicate.

In examples, each RDF tuple of the provided RDF tuples may also comprise a graph. In other words, the method for decompressing RF tuples may be used for decompressing RDF quads that have been compressed by the method discussed in reference to FIG. 1. The method for decompressing RDF quads may also comprise that the provided (120) dictionary of indices also comprises an index being attributed to one of the graphs of the provided RDF tuples. The deserializing (130) the index of the predicate may also comprise deserializing the index of the graph and the generating (180) an RDF tuple being done also with the deserialized index of the graph. It is worth noting that to generate an RDF quad (S180) with the deserialized predicate and the decoded addition, the dictionary provided (S120) may be used to retrieve the value from the index of the subject, the object, the predicate and the graph.

Back to FIG. 4, it is worth noting that the steps S130, S140 and the second for-loop "for each sorted RDF tuple of the group of provided RDF tuples subsequent to the first RDF tuple of the group:" are the body of the first for-loop "for each group of the provided RDF tuples:". The body of the second for-loop being the steps S150, S160, S170 and S180.

In examples, the providing a dictionary (S20, S120) may be replaced by generating a dictionary by indexing one of the subjects, the objects, the predicates and the optional graphs of the provided RDF tuples. For example, the generation of a dictionary may be done any time before the step S30 for compressing RDF tuples. In another example, the generation of a dictionary may be done any time before the step S130 for decompressing RDF tuples.

In examples, the provided or the generated dictionary may be replaced by a provided or generated dictionary of indices of the predicates and the optional graphs and a provided or generated dictionary of indices of the subject and the object. For example, the provided dictionary in step S20 or in step S120 may be replaced by a provided dictionary of indices of the predicates and the optional graphs and by a provided dictionary of indices of the subject and the object. In another example, the provided dictionary in step S20 or in step S120 may be replaced by a provided dictionary of indices of the predicates and the optional graphs and by a generated dictionary of indices of the subject and the object. In another example, the provided dictionary in step S20 or in step S120 may be replaced by a generated dictionary of indices of the predicates and the optional graphs and by a provided dictionary of indices of the subject and the object. In another example, the generated dictionary in step S20 or in step S120 may be replaced by a generated dictionary of indices of the predicates and the optional graphs and by a generated dictionary of indices of the subject and the object. In another example, the generated dictionary in step S20 or in step S120 may be replaced by a provided dictionary of indices of the predicates and the optional graphs and by a generated dictionary of indices of the subject and the object. In another example, the generated dictionary in step S20 or in step S120 may be replaced by a generated dictionary of indices of the predicates and the optional graphs and by a provided dictionary of indices of the subject and the object.

By having one dictionary dedicated to the predicates only or to the predicates and the optional graphs, and another dictionary dedicated to the subjects and the objects, the method allows partial updating. For example, if only the subjects and objects have changed, only one dictionary needs to be updated compared to a situation in which a dictionary dedicated to the predicates, the optional graphs, the subject and the objects would be updated: less computing resources, e.g., for preparing/updating the dictionary and less network resources for transferring the dictionary are required.

In addition, having one dictionary dedicated to the predicates only or to the predicates and the optional graphs, and another dictionary dedicated to the subjects and the objects, allows adopting two different strategies for the dictionary of indices of the predicates and the optional graphs and for the dictionary of indices of the subject and the object. For example, the first dictionary might be provided during the decompression method and/or the compression method as the second dictionary might be generated.

General examples of the compression/decompression methods having been discussed, an example of implementation illustrating the method for compressing RDF tuples and the method for decompressing RDF tuples is now presented; this example of implementation is presented for the sake of illustration only, and it shall not be interpreted as a limitation of the general examples.

The first step is to build the dictionaries and the adjacency matrices. Rather than having a single dictionary, a dictionary for the subjects and objects, a dictionary for the predicates and a dictionary for the graphs may be used. An example of a dictionary for the subjects and objects is given in FIG. 6. An example of a dictionary for the predicates is given in FIG. 7. An example of a dictionary for the graphs is given in FIG. 8. Here, as an example, all data are in one graph, therefore the dictionary for the graphs contain only one pair index-value. Obviously, data may be in different graphs and it would not change the algorithm.

As an example, two distinct dictionaries for graphs and predicates may be used because the probability that the set of graphs and the set of predicates have an intersection is very low. Building two distinct dictionaries is therefore a good option because it is a simple way to implement it but here one dictionary might be used for both graphs and predicates.

Having these dictionaries may allow to convert the RDF tuples into an enumeration using only indices. For example, starting from the example of creation of RDF triple enumeration discussed in reference to FIG. 2, RDF quads enumeration may be obtained by using the dictionary for the graphs for the first index of each line, using the dictionary for the subjects and objects for the second and fourth indices of each line and using the dictionary for the predicates for the third index of each line:

G1, S1, P1, S2
G1, S1, P2, S3
G1, S4, P3, S5
G1, S4, P4, S5
G1, S4, P2, S6
G1, S4, P2, S7

For a better comprehension, as an example, "G1" corresponds to the index with the value "1" of the dictionary for the graphs; "S2" corresponds to the index with the value "2" of the dictionary for the subjects and objects; "P3" corresponds to the index with the value "3" of the dictionary for the predicates.

The RDF tuples may be collected for example in a vector, or a multimap, or any variation of these collections.

As said earlier, the applicant has observed i that the predicate is the entity of the RDF tuples with less entropy. Therefore, grouping first the RDF tuples by predicate may be preferred. This choice may also be interesting in term of processing performance due to the vertical partitioning storage scheme of some databases since it partitions data by predicate too. Since predicate are often tightly bound to their graph, grouping them by graphs may also be preferred. Again, the graph here is optional, omitting it does not change the present embodiments. Permuting predicate and graph is also a solution since they are tightly bound.

The couple (predicate, graph) has been grouped first since it is the entity of the RDF tuples with less entropy, but any other one could have been chosen.

To follow with the above example of RDF quads enumeration, grouping the RDF tuples first by predicate and then by graph may give this result:

P1,G1 ((S1, S2))
P2,G1 ((S1, S3),(S4, S6),(S4, S7))
P3,G1 ((S4, S5))
P4,G1 ((S4, S5))

The next step may be to use a compression scheme on the indices. As an example, a compression scheme which maps multidimensional data to one dimension while preserving locality of the data points may be used; all this with the best performances possible. The Morton encoding, also named Z-order curve is a compression scheme that explores a bitmap by proximity. As an example, the Morton encoding may be used since it maps multidimensional data to one dimension while preserving locality, and its performances are very good due to its constant complexity and the ability to use specific Intel processor instructions to optimize it (e.g., especially Parallel bits deposit PDEP and Parallel bits extract PEXT). However, other compression schemes can be used. Note also that the Morton encoding does not need to be complete to achieve a correlation effect sufficient to benefit from the compression. It could also be a partial Morton encoding, which consumes less Central Processing Unit (CPU).

The applicant has observed that Subject and Object are correlated, the correlation by Morton-encoding each Subject-Object pair may then be further increased. In other words, the values of Subject and Object may be merged both into one value.

Now the serialization may start. As an optional step, the writing of the dictionaries may be done first. Reusing the dictionaries from another serialization may also be done. For example, if this serialization may be used in between nodes of a partitioned or replicated cluster, exchanging only part of adjacency matrices between the nodes and not the dictionaries may be done. The objective may be defined as to serialize the pair of literals and indices built.

The next step may be the serialization of the RDF tuples. To increase even more compression, as an example, the serialization may be done on the differences between indices and not the value of the indices. Doing the serialization on the value of the indices could also be used. To have the difference as small as possible and always in the same direction, a variable length integer to serialize indices as unsigned integers in an even more compressed way may be used. In order to use unsigned integers, the indices may be sorted by the ascending order of their values. Sorting the indices by ascending order may also be chosen to have a suite ever increasing allowing the use of unsigned integers in the disclosure. This also provides an invariant that can be checked for integrity: if the value is out of bound (i.e., for example if the value is lower or equal to zero), it can be detected to raise a warning or even stop the method. For example, the value zero must never be computed. Indeed, since the same pair cannot be seen twice, the null difference is impossible and may be used as an end separator. This choice is optional to make an increased compression, but any order could be chosen, for example a descending order or a partial order; having positive and negative integers are other compatible options.

Here is an example of the method for compressing RDF tuples written in pseudo-code, with P being a predicate of an RDF tuple, G being a graph of an RDF tuple, S being a subject of an RDF tuple and O being an object of an RDF tuple:

For each pair (P, G) of the distinct collected and sorted RDF tuples:
  a. Serializing P and G.
  b. Counting the number of RDF tuples and store the number of pairs (S, O).
  c. Initializing the variable previous pair to "0" (zero).
  d. For each pair (S, O):
    i. Storing the Morton encoding of S and O in the variable current pair.
    ii. If the difference between current pair and previous pair is not "0" (zero), serializing this value in the form of a variable-length integer.
    Else ignoring it because it means it is a duplicate.
    iii. Copying the current pair in the previous pair variable.

An alternative for the method for compressing RDF tuples written in pseudo-code may be written as:

For each pair (P, G) of the distinct collected and sorted RDF tuples:
  a. Serializing P and G.
  b. Initializing the variable previous pair to zero.
  c. For each pair (S, O):
    i. Storing the Morton encoding of S and O in the variable current pair
    ii. If the difference between current pair and previous pair is not zero, serializing this value in the form of a variable-length integer.
    Else ignoring it because it means it is a duplicate.
    iii. Copying the current pair in the previous pair variable.
  d. Zero being a value never used in the previous step (c.iii), serializing "0" (zero) as the terminating value.

As an example, a further compression of the variable-length integer with libraries like LZ4 or Snappy may be done. This may increase the complexity of the decompressing algorithm but can compensate the fact that the dictionaries may be not compressed. Compressing the one or more dictionaries is compatible with the present method and could therefore be done with any known compressing method.

Following our example, sorting the RDF tuples by ascending order of the values may be done:
P1, G1 (9)
P2, G1 (11, 56, 58)
P3, G1 (50)
P4, G1 (50)

The difference between two values of encoded pairs may then be stored. In our example, this step applies only to the group of RDF tuples with a common predicate "P2" since the other groups have only one value:
P2 (11, 45, 2)

The values, predicates and dictionaries may then finally serialize as variable length integers.

Now we will give, as an example, an embodiment of a method for decompressing RDF tuples.

Here is an example of the method for decompressing RDF tuples written in pseudo-code, with P being a predicate of an RDF tuple, G being a graph of an RDF tuple, S being a subject of an RDF tuple and O being an object of an RDF tuple:

Reading the dictionary of SO and the dictionary of PG.
For each pair PG:
  a. Deserializing of the pair PG.
  b. Deserializing of the number of pairs SO for this PG pair.
  c. Initializing the variable previous pair to zero.
  d. Repeating number of pairs times:
    i. Deserializing of the current SO.
    ii. Adding the value of the previous pair SO to the value of the current pair SO therefore the current pair SO now holds the value of the S and the O encoded with the Morton encoding.
    iii. Extracting SO using Morton extraction.
    iv. Producing an RDF with the indices of P, G, S and O and with the dictionaries.
    v. Storing the current SO in the variable previous pair.

As an example, we will now apply this algorithm to the followed example. The first step consists of repeating the reading of the pairs Predicate Graph and the number of pairs Subject Object. At this point, a block of data of the serialized graphs is obtained. For the sake of simplicity, padding and field boundary are omitted. This can be a tag, a prolog containing the size or the number of loops to perform, or an invalid pair Graph Predicate acting as an end sentinel. Here is an example of data obtained at the end of this step:
P1, G1 1 (9)
P2, G1 3 (11, 56, 58)
P3, G1 1 (50)
P4, G1 1 (50)

As an example, here is the application of the pseudo-code of the present method for decompressing RDF tuples based on the followed example.

Below is the first loop:
a. Reading the indices of P1 and G1.
b. Reading the number of subjects and objects (1).
c. Initializing the variable previous pair to "0" (zero).
d. for each pair SO (doing it only once for the first loop):
   i. Deserializing the current value of the pair SO (9).
   ii. Adding the variable previous pair to the current value of SO (0+9) therefore the current SO now holds the value of S and O encoded with the Morton encoding.
   iii. Extracting with a Morton extraction the value of the index of S and O (1, 2).
   iv. Producing an RDF with the indices of P, G, S and O and with the dictionaries.
   v. Storing the value of the current SO in the variable previous pair.

Below is the second loop:
a. Reading the indices of P2 and G1.
b. Reading the number of subjects and objects (3).
c. Initializing the variable previous pair to "0" (zero).
d. for each pair (doing it three times for the second loop):
   i. Deserializing the current value of the pair SO (respectively for each pair SO 11, 45 and 2).
   ii. Adding the variable previous pair to the current value of SO (respectively for each pair SO 11, 56, 58 as the result of 11+0, 45+11+0 and 2+45+11+0) therefore the current SO now holds the value of S and O encoded with the Morton encoding.
   iii. Extracting with a Morton extraction the value of the index of S and O (respectively for each pair SO (1, 3), (4, 6) and (4, 7)).
   iv. Producing an RDF with the indices of P, G, S and O and with the dictionaries.
   v. Storing the value of the current SO in the variable previous pair.

Below is the third loop:
a. Reading the indices P3 and G1 (3 and 1).
b. Reading the number of subjects and objects (1).
c. Initializing the variable previous pair to "0" (zero).
d. for each pair SO (doing it only once for the first loop):
   i. Deserializing the current value of the pair SO (50).
   ii. Adding the variable previous pair to the current value of SO (0+50) therefore the current SO now holds the value of S and O encoded with the Morton encoding.
   iii. Extracting with a Morton extraction the value of the index of S and O (4, 5).
   iv. Producing an RDF with the indices of P, G, S and O and with the dictionaries.
   v. Storing the value of the current SO in the variable previous pair.

Below is the fourth and last loop:
a. Reading the indices of P4 and G1 (4 and 1).
b. Reading the number of subjects and objects (1).
c. Initializing the variable previous pair to "0" (zero).
d. for each pair SO (doing it only once for the first loop):
   i. Deserializing the current value of the pair SO (50).
   ii. Adding the previous pair to the current value of SO (0+50) therefore the current SO now holds the value of S and O encoded with the Morton encoding.
   iii. Extracting with a Morton extraction the value of the index of S and O (4, 5).
   iv. Producing an RDF with the indices of P, G, S and O and with the dictionaries.
   v. Storing the value of the current SO in the variable previous pair.

The present method, for both the compression and the decompression, may be adapted to implement a visitor (a definition of visitor may be found at en.wikipedia.org/wiki/Visitor_pattern), an iterator (a definition of iterator may be found en.wikipedia.org/wiki/Iterator_pattern), or to build a collection of RDF tuples by adding the step 2.d.v as needed.

The embodiments have been described. It will be understood that various modifications may be made without departing from the spirit and scope of the disclosure. Therefore, other implementations are within the scope of the following claims.

The invention claimed is:

1. A computer-implemented method for compressing at least a thousand of Resource Description Framework (RDF) tuples to be transferred from a target source to a database on which the RDF tuples are stored and accessible on a single node database server, the compression being computed by a computer including a processing circuitry communicatively coupled with a memory storing the target source, the method comprising:
   obtaining RDF tuples, each RDF tuple having a subject, an object and a predicate;
   obtaining a dictionary of indices, each index being attributed to one of the subjects, the objects and the predicates of the obtained RDF tuples;
   encoding, for each RDF tuple, the indices attributed to the subject and the object of each RDF tuple;
   grouping RDF tuples sharing a same predicate and for each group sorting the grouped RDF tuples by considering the encoding of indices attributed to the subject and the object of each RDF tuple in each group; and
   for each group of sorted RDF tuples:
      serializing the index attributed to the shared predicate;
      serializing the encoding of the indices attributed to the subject and the object of a first RDF tuple of the group of sorted RDF tuples; and
      for each RDF tuple of the group of sorted RDF tuples subsequent to the first RDF tuple of the group:
         computing a difference between the encoding of the indices attributed to the subject and the object of a current RDF tuple and the encoding of the indices attributed to the subject and the object of a previous RDF tuple;
         serializing the computed difference in a form of a variable-length integer; and
      storing, on the memory, the compressed RDF tuples in a space saving manner.

2. The computer-implemented method of claim 1, wherein the encoding is a Morton encoding.

3. The computer-implemented method of claim 2, wherein the sorted RDF tuples of each group are sorted by increasing order or a partial increasing order or partially only.

4. The computer-implemented method of claim 2, wherein:
   each RDF tuple of the obtained RDF tuples also comprises a graph,
   the obtained dictionary of indices also includes an index being attributed to one of the graphs of the obtained RDF tuples,
   the grouping is done for RDF tuples sharing a same predicate and a same graph, and
   the serializing of the index attributed to the shared predicate also includes a serializing of the index attributed to the shared graph.

5. The computer-implemented method of claim 1, wherein the sorted RDF tuples of each group are sorted by increasing order or a partial increasing order or partially only.

6. The computer-implemented method of claim 5, wherein:
each RDF tuple of the obtained RDF tuples also comprises a graph,
the obtained dictionary of indices also includes an index being attributed to one of the graphs of the obtained RDF tuples,
the grouping is done for RDF tuples sharing a same predicate and a same graph, and
the serializing of the index attributed to the shared predicate also includes a serializing of the index attributed to the shared graph.

7. The computer-implemented method of claim 1, wherein:
each RDF tuple of the obtained RDF tuples also comprises a graph,
the obtained dictionary of indices also includes an index being attributed to one of the graphs of the obtained RDF tuples,
the grouping is done for RDF tuples sharing a same predicate and a same graph, and
the serializing of the index attributed to the shared predicate also includes a serializing of the index attributed to the shared graph.

8. The computer-implemented method of claim 1, wherein the variable-length integer is further compressed with a lossless compression.

9. The computer-implemented method of claim 1, wherein the grouping also includes counting the RDF tuples sharing the same predicate.

10. A computer-implemented method for compressing at least a thousand of Resource Description Framework (RDF) tuples to be transferred from a target source to a database on which the RDF tuples are stored and accessible on a single node database server, the compression being computed by a computer including a processing circuitry communicatively coupled with a memory storing the target source and decompressing compressed RDF tuples, comprising:
compressing the RDF tuples including:
obtaining RDF tuples, each RDF tuple having a subject, an object and a predicate;
obtaining a dictionary of indices, each index being attributed to one of the subjects, the objects and the predicates of the obtained RDF tuples;
encoding, for each RDF tuple, the indices attributed to the subject and the object of each RDF tuple;
grouping RDF tuples sharing a same predicate and for each group sorting the grouped RDF tuples by considering the encoding of indices attributed to the subject and the object of each RDF tuple in each group; and
for each group of sorted RDF tuples:
serializing the index attributed to the shared predicate;
serializing the encoding of the indices attributed to the subject and the object of a first RDF tuple of the group of sorted RDF tuples; and
for each RDF tuple of the group of sorted RDF tuples subsequent to the first RDF tuple of the group:
computing a difference between the encoding of the indices attributed to the subject and the object of a current RDF tuple and the encoding of the indices attributed to the subject and the object of a previous RDF tuple;
serializing the computed difference in a form of a variable-length integer; and
storing, on the memory, the compressed RDF tuples in a space saving manner; and
the decompressing the compressed RDF tuples including:
obtaining the compressed RDF tuples;
obtaining the dictionary of indices, each index being attributed to one of the subjects, the objects and the predicates of the obtained compressed RDF tuples;
for each group of the obtained compressed RDF tuples:
deserializing the index attributed to the shared predicate;
deserializing the encoding of the indices attributed to the subject and the object of the first compressed RDF tuple of the group of obtained compressed RDF tuples; and
for each sorted compressed RDF tuple of the group of obtained compressed RDF tuples subsequent to the first compressed RDF tuple of the group:
deserializing the computed difference;
computing an addition between the deserialized computed difference of a current compressed RDF tuple and the deserialized computed difference of a previous compressed RDF tuple;
decoding the computed addition; and
generating a decompressed RDF tuple with the deserialized predicate and the decoded addition.

11. The computer-implemented method of claim 10, wherein:
each compressed RDF tuple of the obtained compressed RDF tuples also includes a graph;
the obtained dictionary of indices also includes an index being attributed to one of the graphs of the obtained compressed RDF tuples;
the deserializing the index attributed to the predicate also includes deserializing the index attributed to the graph; and
the generating the decompressed RDF tuple is done with also the deserialized index attributed to the graph.

12. A non-transitory computer readable storage medium having recorded thereon a method for compressing at least a thousand of Resource Description Framework (RDF) tuples that are transferred from a target source to a database on which the RDF tuples are stored and accessible on a single node database server, the compression being computed by a computer including processing circuitry communicatively coupled with a memory storing the target source, the method comprising:
obtaining RDF tuples, each RDF tuple having a subject, an object and a predicate;
obtaining a dictionary of indices, each index being attributed to one of the subjects, the objects and the predicates of the obtained RDF tuples;
encoding, for each RDF tuple, the indices attributed to the subject and the object of each RDF tuple;
grouping RDF tuples sharing a same predicate and for each group sorting the grouped RDF tuples by considering the encoding of indices attributed to the subject and the object of each RDF tuple in each group; and
for each group of sorted RDF tuples:
serializing the index attributed to the shared predicate;
serializing the encoding of the indices attributed to the subject and the object of a first RDF tuple of the group of sorted RDF tuples; and
for each RDF tuple of the group of sorted RDF tuples subsequent to the first RDF tuple of the group:
computing a difference between the encoding of the indices attributed to the subject and the object of a current RDF tuple and the encoding of the indices attributed to the subject and the object of a previous RDF tuple;

serializing the computed difference in a form of a variable-length integer; and storing, on the memory, the compressed RDF tuples in a space saving manner.

13. A database comprising the non-transitory computer readable storage medium of claim 12.

* * * * *